(12) United States Patent
Cheng

(10) Patent No.: US 12,305,099 B2
(45) Date of Patent: May 20, 2025

(54) METAL OXIDE NANOPARTICLES AND PREPARATION METHOD THEREOF, QUANTUM DOT LIGHT-EMITTING DIODE

(71) Applicant: TCL TECHNOLOGY GROUP CORPORATION, Guangdong (CN)

(72) Inventor: Luling Cheng, Guangdong (CN)

(73) Assignee: TCL Technology Group Corporation, Huizhou (CN)

( * ) Notice: Subject to any disclaimer, the term of this patent is extended or adjusted under 35 U.S.C. 154(b) by 503 days.

(21) Appl. No.: 17/733,050

(22) Filed: Apr. 29, 2022

(65) Prior Publication Data

US 2022/0267671 A1    Aug. 25, 2022

Related U.S. Application Data

(63) Continuation of application No. PCT/CN2020/125188, filed on Oct. 30, 2020.

(30) Foreign Application Priority Data

Oct. 30, 2019   (CN) .......................... 201911043479.6

(51) Int. Cl.
| | |
|---|---|
| C09K 11/54 | (2006.01) |
| B82Y 20/00 | (2011.01) |
| B82Y 40/00 | (2011.01) |
| C01G 9/02 | (2006.01) |
| C01G 53/04 | (2025.01) |
| C09K 11/60 | (2006.01) |
| H10K 50/115 | (2023.01) |

(52) U.S. Cl.
CPC .............. *C09K 11/54* (2013.01); *C01G 9/02* (2013.01); *C01G 53/04* (2013.01); *C09K 11/602* (2013.01);
(Continued)

(58) Field of Classification Search
CPC ........ H01K 5/115; C09K 11/08; C09K 11/54; C09K 11/602; C09K 11/02; C09K 11/60;
(Continued)

(56) References Cited

FOREIGN PATENT DOCUMENTS

| CN | 101343536 A | 1/2009 |
|---|---|---|
| CN | 105985774 A | 10/2016 |

(Continued)

OTHER PUBLICATIONS

Translation of International Search Report for International Application No. PCT/CN2020/125188; Date of Completion: Dec. 28, 2020; Date of Mailing: Jan. 8, 2021; 2 Pages.

(Continued)

*Primary Examiner* — Daniel C. McCracken
*Assistant Examiner* — Joshua Maxwell Speer
(74) *Attorney, Agent, or Firm* — Osha Bergman Watanabe & Burton LLP

(57) ABSTRACT

The present application discloses a method for preparing metal oxide nanoparticles, including the following steps: providing an organic reagent with a molecular formula of X—(SO$_2$)—Y and a metal oxide nanoparticle sample, in which the metal oxide nanoparticle sample is an aqueous metal oxide nanoparticle; in X—(SO$_2$)—Y, X contains polar functional groups; mixing the organic reagent and the metal oxide nanoparticle sample in a liquid medium and adding an alkaline reagent to a mixed solution of the organic reagent and the metal oxide nanoparticle sample to prepare the metal oxide nanoparticles. The method provided in the present application can reduce the surface defect state of metal oxide nanoparticles, thereby improving the stability of metal oxide nanoparticles.

16 Claims, 1 Drawing Sheet

Providing an organic reagent having a molecular formula of X-(SO$_2$)-Y and a metal oxide nanoparticle sample, wherein the metal oxide nanoparticle sample is an aqueous metal oxide nanoparticle; in X-(SO$_2$)-Y, X contains a polar functional group — S01

Mixing the organic reagent and the metal oxide nanoparticle sample in a liquid medium to obtain a resulting mixed solution and adding an alkaline reagent to the resulting mixed solution to prepare the metal oxide nanoparticles — S02

(52) U.S. Cl.
CPC ............ *H10K 50/115* (2023.02); *B82Y 20/00* (2013.01); *B82Y 40/00* (2013.01); *C01P 2004/64* (2013.01)

(58) Field of Classification Search
CPC ....... C09K 11/025; B82Y 20/00; B82Y 40/00; B82Y 30/00; C01G 9/02; C01G 53/04; H10K 50/115; C01P 2004/64; H10H 20/851; H10H 20/8512
See application file for complete search history.

(56) References Cited

FOREIGN PATENT DOCUMENTS

| | | | |
|---|---|---|---|
| CN | 106479503 | A | 3/2017 |
| CN | 108977195 | A | 12/2018 |
| CN | 109762557 | A | 5/2019 |
| EP | 1116036 | B1 | 8/2004 |
| JP | S61277661 | A * | 12/1986 |
| JP | 2009197320 | A | 9/2009 |
| KR | 20190112653 | A * | 10/2019 |
| WO | 2016151933 | A1 | 9/2016 |

OTHER PUBLICATIONS

International Search Report for International Application No. PCT/CN2020/125188; Date of Completion: Dec. 28, 2020; Date of Mailing: Jan. 8, 2021; 3 Pages.
Written Opinion for International Application No. PCT/CN2020/125188; Date of Mailing: Jan. 8, 2021; 3 Pages.

* cited by examiner

```
┌─────────────────────────────────────────────────────────┐
│ Providing an organic reagent having a molecular formula │
│ of X-(SO₂)-Y and a metal oxide nanoparticle sample,     │──— S01
│ wherein the metal oxide nanoparticle sample is an       │
│ aqueous metal oxide nanoparticle; in X-(SO₂)-Y, X       │
│ contains a polar functional group                       │
└─────────────────────────────────────────────────────────┘
                            │
                            ▼
┌─────────────────────────────────────────────────────────┐
│ Mixing the organic reagent and the metal oxide          │──— S02
│ nanoparticle sample in a liquid medium to obtain a      │
│ resulting mixed solution and adding an alkaline reagent │
│ to the resulting mixed solution to prepare the metal    │
│ oxide nanoparticles                                     │
└─────────────────────────────────────────────────────────┘
```

METAL OXIDE NANOPARTICLES AND PREPARATION METHOD THEREOF, QUANTUM DOT LIGHT-EMITTING DIODE

CROSS REFERENCE TO RELATED APPLICATION

This application is a continuation application of International Patent Application No. PCT/CN2020/125188 with an international filing date of Oct. 30, 2020, designating the United States, now pending, and further claims priority benefits to Chinese Patent Application No. 201911043479.6 filed Oct. 30, 2019. The contents of all of the aforementioned applications, including any intervening amendments thereto, are incorporated herein by reference.

BACKGROUND

Technical Field

The present application relates to the technical field of nanoparticles, in particular to metal oxide nanoparticles and a preparation method thereof, and a quantum dot light-emitting diode.

Description of Related Art

Quantum dots are semiconductor nanostructures that bind excitons in three spatial directions. With the development of quantum dot technology, the application of quantum dots has penetrated into many fields, especially in the fields of quantum dot light-emitting diodes, solar cells, biomarkers, etc., especially biofluorescence labeling technology.

Among quantum dot products, the stability of quantum dots has a great impact on the application of the product. The factors affecting the stability of quantum dots mainly come from two aspects: on the one hand, due to the large exciton radius of the quantum dot itself, the surface states of the quantum dots are relatively active, resulting in poor stability; on the other hand, the defect states existing on the surface of the quantum dots, the defects are too easily oxidized, resulting in the instability of quantum dots. At present, improving the stability of quantum dots is mainly achieved by improving the surface defect states of quantum dots. However, most of the traditional methods passivate the surface of quantum dots by growing a layer of inorganic shell with a wide band gap on the surface of quantum dots, thereby reducing the surface defect states of quantum dots. However, the quantum dots prepared by this method will have lattice adaptation defects, which will widen the emission peak width of the quantum dots, thereby affecting the color purity.

SUMMARY

The purpose of the embodiments of the present application is to provide a kind of metal oxide nanoparticles and preparation method thereof, quantum dot light-emitting diode, aiming to improve the stability of quantum dots by growing a layer of inorganic shell layer with a wide band gap on the surface of quantum dots. The existing method has the problem of lattice adaptation defects, resulting in the broadening of the emission peak width of the quantum dots, which in turn affects the color purity.

The technical scheme adopted in the embodiment of the present application is as follows:

In a first aspect, a method for preparing metal oxide nanoparticles is provided. The method comprises the following steps: providing an organic reagent with a molecular formula of X—(SO$_2$)—Y and a metal oxide nanoparticle sample, in which the metal oxide nanoparticle sample is an aqueous metal oxide nanoparticle; in X—(SO$_2$)—Y, X contains polar functional groups; mixing the organic reagent and the metal oxide nanoparticle sample in a liquid medium and adding an alkaline reagent to a mixed solution of the organic reagent and the metal oxide nanoparticle sample to prepare the metal oxide nanoparticles.

In some embodiments, the polar functional groups are at least one selected from the group consisting of hydroxyl, carboxyl and amino.

In some embodiments, in the organic reagent with the molecular formula of X—(SO$_2$)—Y, X is one selected from the group consisting of —(CH$_2$)$_n$—NH$_2$; (CH$_2$)$_n$—OH, —(CH$_2$)$_n$—COOH, in which n is an integer ranging between 1 and 18.

In some embodiments, the organic reagent with molecular formula of X—(SO$_2$)—Y is at least one selected from the group consisting of OH—(CH$_2$)$_n$—(SO$_2$)—(CH$_2$)$_m$—NH$_2$, OH—(CH$_2$)$_n$—(SO$_2$)—(CH$_2$)$_m$—COOH, OH—(CH$_2$)$_n$—(SO$_2$)—(CH$_2$)$_m$—OH, NH$_2$—(CH$_2$)$_n$—(SO$_2$)—(CH$_2$)$_m$—NH$_2$ and COOH—(CH$_2$)$_n$—(SO$_2$)—(CH$_2$)$_m$—COOH, in which m is an integer ranging between 1 and 18.

In some embodiments, the liquid medium is at least one selected from the group consisting of ethanol, methanol, isopropanol, acetonitrile, and tetrahydrofuran.

In some embodiments, the step of mixing the organic reagent and the metal oxide nanoparticle sample in a liquid medium comprises: dissolving the organic reagent in the liquid medium to form an organic solution; mixing the organic solution with the metal oxide nanoparticle sample.

In some embodiments, in the organic solution, a concentration of the organic reagent is 0.1-10 mmol/L.

In some embodiments, in the step of mixing the organic reagent and the metal oxide nanoparticle sample in a liquid medium, a molar/mass ratio of the organic reagent to the metal oxide nanoparticles is (1-50 mmol): 100 mg.

In some embodiments, the alkaline reagent is at least one selected from the group consisting of ammonia water and tetramethylammonium hydroxide.

In some embodiments, in the step of mixing the organic reagent and the metal oxide nanoparticle sample in a liquid medium and adding alkaline reagent thereafter, the preparation method further comprises adding a precipitant to an obtained mixed system.

In some embodiments, in the step of adding precipitant to the mixing system obtained, adding a precipitant to the mixed system according to the volume ratio of the precipitant and the mixing system of (1-5): 1.

In some embodiments, in the step of mixing the organic reagent and the metal oxide nanoparticle sample in a liquid medium and adding alkaline reagent, a method for adding the alkaline reagent is as follows: in an inert atmosphere, adding the alkaline reagent to the mixed solution under stirring condition.

In some embodiments, in the step of adding alkaline reagent to the mixed solution, adding the alkaline reagent to the mixed solution according to a molar dosage ratio of the alkaline reagent and the organic reagent of (1-3): 1.

In some embodiments, the stirring condition comprises a stirring time, and the stirring time is 10-120 min.

A second aspect provides metal oxide nanoparticles, wherein the metal oxide nanoparticles are prepared by the method for preparing metal oxide nanoparticles provided in the first aspect.

In a third aspect, a quantum dot light-emitting diode is provided, which includes a quantum dot light-emitting layer, and the material of the quantum dot light-emitting layer are the metal oxide nanoparticles provided in the second aspect.

The beneficial effect of the method for preparing metal oxide nanoparticles provided by the embodiments of the present application is that: after the metal oxide nanoparticle sample is mixed with the organic reagent with molecular formula of X—($SO_2$)—Y, the alkaline reagent is added to the mixed solution. Under the action of the alkaline reagent and the organic reagent has a chemical reaction to generate X—($SO_2$)—$O^-$ containing oxygen anions (the reaction mechanism is: X—($SO_2$)—Y+$_2$$OH^-$→X—($SO_2$)—$O^-$+Y—OH+$H^+$). The oxygen anions in X—($SO_2$)—$O^-$ can quickly combine with metal atoms on the surface of metal oxide nanoparticles and fill the oxygen vacancies on the surface, thereby achieving passivation of metal oxide nanoparticles and reducing the surface defect state of metal oxide nanoparticles, thereby improving the stability of metal oxide nanoparticles.

The beneficial effect of the quantum dots provided by the embodiments of the present application is that: since the quantum dots are prepared by the above method, the metal atoms on the surface of the metal oxide nanoparticles are bound with X—($SO_2$)—$O^-$, the oxygen anions in X—($SO_2$)—$O^-$ can quickly combine with the metal atoms on the surface of the metal oxide nanoparticles and fill the oxygen vacancies on the surface, thereby realizing the passivation of the metal oxide nanoparticles, reducing the surface defect state of the metal oxide nanoparticles, and improving the stability of the metal oxide nanoparticles.

The beneficial effect of the quantum dot light-emitting diode provided by the embodiments of the present application is that since the material of the quantum dot light-emitting layer is the above-mentioned metal oxide nanoparticles, the quantum dot light-emitting layer has excellent stability.

BRIEF DESCRIPTION OF DRAWINGS in order to illustrate the technical solutions in the embodiments of the present application more clearly, the following briefly introduces the accompanying drawings that are used in the description of the embodiments or exemplary technologies. Obviously, the drawings in the following description are only for the present application. In some embodiments, for those of ordinary skill in the art, other drawings can also be obtained according to these drawings without any creative effort.

FIG. 1 is a schematic flowchart of a method for preparing metal oxide nanoparticles provided by an embodiment of the present application.

DETAILED DESCRIPTION

In order to make the purpose, technical solutions and advantages of the present application more clearly understood, the present application will be described in further detail below with reference to the accompanying drawings and embodiments. It should be understood that the specific embodiments described herein are only used to explain the present application, but not to limit the present application.

It should be noted that the terms of "first" and "second" are only used for the convenience of description, and should not be understood as indicating or implying relative importance or implying indicating the number of technical features. Thus, a feature defined as "first" or "second" may expressly or implicitly include one or more of that feature. The term of "a plurality of" means two or more, unless expressly specifically limited otherwise.

As shown in FIG. 1, the embodiment of the present application provides a method for preparing metal oxide nanoparticles, comprising the following steps:

S01. Providing organic reagent and metal oxide nanoparticle sample with molecular formula of X—($SO_2$)—Y, and the metal oxide nanoparticle sample is aqueous metal oxide nanoparticle; in X—($SO_2$)—Y, X contains polar functional groups;

S02. Mixing organic reagent and metal oxide nanoparticle sample in liquid medium and adding an alkaline reagent to prepare metal oxide nanoparticles.

In the method for preparing metal oxide nanoparticles provided in the embodiments of the present application, after the metal oxide nanoparticle sample was mixed with the organic reagent with molecular formula of X—($SO_2$)—Y, the alkaline reagent was added, and the organic reagent undergoes a chemical reaction under the action of the alkaline reagent to generate X—($SO_2$)—$O^-$ containing oxygen negative ions (reaction mechanism: X—($SO_2$)—Y+2$OH^-$→X—($SO_2$)—$O^-$+Y—OH+$H^+$). The oxygen anions in X—($SO_2$)—$O^-$ can quickly combine with metal atoms on the surface of metal oxide nanoparticles and fill the oxygen vacancies on the surface, thereby achieving passivation of metal oxide nanoparticles and reducing the surface defect state of metal oxide nanoparticles, thereby improving the stability of metal oxide nanoparticles.

Specifically, in the above step S01, the metal oxide nanoparticle sample is conventional metal oxide nanoparticles, including but not limited to ZnO, NiO, $W_2O_3$, $Mo_2O_3$, $TiO_2$, SnO, $ZrO_2$, $Ta_2O_3$. Due to the easy introduction of functional groups such as carboxyl during the preparation of oil-phase metal oxide nanoparticles, it is difficult for oxygen anions to bind and fill their oxygen vacancies. Therefore, the metal oxide nanoparticle sample in the embodiment of the present application is an aqueous metal oxide nanoparticle, that is, the surface of the metal oxide nanoparticle sample contains an aqueous ligand. Specifically, the aqueous ligands include but are not limited to —($CH_2$)$_a$—OH, —($CH_2$)$_a$—COOH, —($CH_2$)$_a$—$NH_2$, wherein the value of a is 0-18.

In the organic reagent with the molecular formula of X—($SO_2$)—Y, the strong electron withdrawing function of —($SO_2$)— (can also be expressed as —S($O_2$)$^-$) promotes dissociation of X—($SO_2$)—$O^-$ under the action of X—($SO_2$)—Y in the alkaline reagent and formation of oxygen negative ions on the side of —($SO_2$)—, so as to solve the problem of many surface defect states of the water-phase metal oxide nanoparticle sample through X—($SO_2$)—$O^-$. In the embodiments of the present application, in the organic reagent with the molecular formula of X—($SO_2$)—Y, at least X contains polar functional groups, so that the organic reagent with the molecular formula X—($SO_2$)—Y remains hydrophilic as a whole and can fully disperse with metal oxide nanoparticle sample, which is beneficial for the dissociated X—($SO_2$)—$O^-$ to quickly combine with the metal atoms on the surface of the metal oxide nanoparticles and fill the oxygen vacancies on the surface. In the organic reagent with the molecular formula of X—($SO_2$)—Y, the choice of Y is relatively flexible, with or without polar functional groups, as long as the number of carbon atoms is 1-18. To ensure the water-soluble character of X—($SO_2$)—Y, in some implementations Y contains polar functional groups. Specifically, the polar functional groups are at least one selected from the group consisting of hydroxyl, carboxyl, and amino, hydroxyl, in some embodiments.

In some embodiments, in the organic reagent with molecular formula of X—($SO_2$)—Y, X is one selected from the group consisting of —($CH_2$)$_n$—$NH_2$, —($CH_2$)$_n$—OH, —($CH_2$)$_n$—COOH, where n is an integer from 1 to 18. In some embodiments, X is an alkane structure of a hydrocarbon main chain, except hydroxyl, carboxyl, and amino, without other functional groups, so that the introduction of other hanging energy groups or complex structures can be avoided, and the molecular formula is X—($SO_2$)$^-$ The reaction between the organic reagent of Y and the alkaline reagent hinders the formation of negative oxygen ions. When n is an integer ranging from 1 to 18, the organic reagent with the molecular formula X—($SO_2$)—Y has better water solubility and better dispersibility with the water-phase metal oxide nanoparticle sample, which is beneficial to the follow-up passivation of water-phase metal oxide nanoparticle samples, and the above selection will not affect the passivation efficiency due to the excessively long carbon chain length, resulting in excessive viscosity.

In the examples of this application, in the organic reagent with molecular formula of X—($SO_2$)—Y, X is one selected from the group consisting of —($CH_2$)$_n$—$NH_2$, —($CH_2$)$_n$—OH, and —($CH_2$)$_n$—COOH, the choice of Y is not strictly limited, and can contain polar groups or not. In some embodiments, in the organic reagent with molecular formula of X—($SO_2$)—Y, Y does not contain a polar group, and can be an alkyl group, a cycloalkyl group or a hydrogen atom. For example: Y is one selected from an alkyl group with 1-18 carbon atoms, or a cycloalkyl group with 3-8 carbon atoms. In some specific embodiments, the organic reagent with molecular formula of X—($SO_2$)—Y is one selected from the group consisting of OH—($CH_2$)$_n$—($SO_2$)—($CH_2$)$_m$—$CH_3$, $CH_3$—($CH_2$)$_n$—($SO_2$)—($CH_2$)$_m$—COOH, $CH_3$—($CH_2$)n-($SO_2$)—($CH_2$)$_m$—OH, $CH_3$—($CH_2$)$_n$—($SO_2$)—($CH_2$)$_m$—$NH_2$, $CH_3$—($CH_2$)$_n$—($SO_2$)—($CH_2$)$_m$—COOH, $CH_3$—($CH_2$)$_n$—($SO_2$)—($CH_2$)$_m$—$NH_2$, OH—($CH_2$)$_n$—($SO_2$)—($CH_2$)$_m$—$CH_3$, OH—($CH_2$)$_n$—($SO_2$)—($CH_2$)$_m$—$CH_3$, $NH_2$—($CH_2$)$_n$—($SO_2$)—($CH_2$)$_m$—$CH_3$, COOH—($CH_2$)$_n$—($SO_2$)—($CH_2$)$_m$—$CH_3$.

In some embodiments, in the organic reagent with molecular formula of X—($SO_2$)—Y, Y contains a polar group. In some specific embodiments, the organic reagent with molecular formula of X—($SO_2$)—Y is at least one selected from OH—($CH_2$)$_n$—($SO_2$)—($CH_2$)$_m$—$NH_2$, OH—($CH_2$)$_n$—($SO_2$)—($CH_2$)$_m$—COOH, OH—($CH_2$)$_n$—($SO_2$)—($CH_2$)$_m$—OH, $NH_2$—($CH_2$)$_n$—($SO_2$)—($CH_2$)$_m$—$NH_2$, COOH—($CH_2$)$_n$— of ($SO_2$)—($CH_2$)$_m$—COOH, n is an integer ranging from 1 to 18, and m is an integer ranging from 1 to 18. In the above organic reagent, the main chain carbon atoms in X and Y are controlled in an appropriate range, which can prevent the free end of the group on the surface of the prepared metal oxide nanoparticles from being too long, thereby avoiding reducing the film-forming performance of the metal oxide nanoparticles due to high viscosity.

It should be understood that, in the organic reagent with the molecular formula of X—($SO_2$)—Y in the examples of this application, X and Y are just numbers to distinguish each other, and X is defined to indicate that one of the groups needs to meet the requirements of "contain polar functional groups" feature. Of course, Y can also be limited to satisfy the feature of "contains polar functional groups". However, no matter whether X is limited or Y is limited, it is only limited to a group adjacent to —($SO_2$)— in X—($SO_2$)—Y, and there is no essential difference.

In the above step S02, the organic reagent and the metal oxide nanoparticle sample are mixed in a liquid medium, so that the metal oxide nanoparticle sample and the organic reagent are mixed evenly, and a mixed solution of the organic reagent and the metal oxide nanoparticle sample is obtained.

In the embodiment of the present application, the liquid medium is used as a dispersion medium to dissolve and disperse the organic reagent, so that the organic reagent can be fully dispersed with the metal oxide nanoparticle sample, so that after the organic reagent is dissociated into X—($SO_2$)—O— containing oxygen anions, which can smoothly combine with the metal atoms of the metal oxide nanoparticle sample and fill the oxygen vacancies on the surface. In some embodiments, the liquid medium is at least one selected from the group consisting of ethanol, methanol, isopropanol, acetonitrile, and tetrahydrofuran.

In some embodiments, the step of mixing the organic reagent and the metal oxide nanoparticle sample in the liquid medium includes: dissolving the organic reagent in the liquid medium to form an organic solution; and mixing the organic solution with the metal oxide nanoparticle sample.

In some embodiments, in the organic reagent solution, the concentration of the organic reagent is 0.1-10 mmol/L. The concentration of the organic reagent is related to the molecular weight of the organic reagent listed above. When the molecular weight of the organic reagent is relatively small, the concentration of the organic reagent is relatively high, so that the content of organic molecules containing oxygen anions after dissociation of the organic reagent is relatively high, which can be uniformly and fully distributed and bound around the surface of the metal oxide nanoparticles. When the molecular weight of the organic reagent is larger, the molecular weight of the dissociated corresponding organic molecules is also larger. Then if the content is too high, after a small amount of oxygen anion is combined with the metal oxide nanoparticles, due to the too large steric hindrance, it is not beneficial to the subsequent combination of oxygen anions and metal oxide nanoparticles.

In the examples of the present application, in the step of mixing the organic reagent and the metal oxide nanoparticle sample in the liquid medium, according to the molar mass ratio of the organic reagent to the metal oxide nanoparticles (1-50 mmol): 100 mg, the organic reagent and metal oxide nanoparticle sample are mixed. If the content of the organic reagent is too low, the content of organic molecules containing oxygen anions dissociated from the organic reagent is low, and the passivation effect on the metal oxide nanoparticle sample is not good. If the content of the organic reagent is too high, the organic reagent is likely to remain, and the residual organic molecules are introduced into the metal oxide nanoparticles as impurities, affecting the performance of the metal oxide nanoparticles. In particular, when metal oxide nanoparticles are used as a light-emitting layer material in a light-emitting device, since the residual organic reagent is an insulating molecule, it is not conductive by itself, thereby reducing the light-emitting efficiency of the obtained quantum dot light-emitting layer.

In some embodiments of the present application, the organic reagent and the metal oxide nanoparticle sample were mixed and processed in a liquid medium at a temperature of 20-60° C. In some embodiments, the gas environment in which the organic reagent and the metal oxide nanoparticle sample are mixed in a liquid medium is an inert atmosphere, so as to prevent the introduction of oxidizing gas and interfere with the reduction reaction in the following steps.

Adding an alkaline reagent to the mixture to react with X—($SO_2$)—Y to obtain X—($SO_2$)—$O^-$ containing oxygen anion (the reaction mechanism is: X—($SO_2$)—Y+$2OH^-$ →X—($SO_2$)—$O^-$+Y—OH+$H^+$). The oxygen anions in X—($SO_2$)—$O^-$ generated by the reaction can quickly combine with metal atoms on the surface of metal oxide nanoparticles and fill the oxygen vacancies on the surface, thereby achieving passivation of metal oxide nanoparticles and reducing surface defects of metal oxide nanoparticles state, thereby improving the stability of metal oxide nanoparticles.

In some embodiments, the alkaline reagent is an alkaline reagent that is soluble in polar reagents, so as to ensure that the reaction with X—($SO_2$)—Y can proceed smoothly. In some embodiments, the alkaline reagent is one selected from the group consisting of ammonia water, tetramethylammonium hydroxide, but not limited thereto. The above alkaline reagent can quickly react with X—($SO_2$)—Y to obtain X—($SO_2$)—$O^-$ containing oxygen negative ions.

In some embodiments, in the step of adding the alkaline reagent to the mixed solution, the alkaline reagent was added to the mixed solution according to the molar ratio of the alkaline reagent to the organic reagent in a ratio of (1-3):1.

In the examples of the present application, the alkaline reagent was added to the mixed solution, the alkaline reagent can be added at one time, or can be added slowly, such as dropwise. In some embodiments, adding alkaline reagent to the mixture was performed at 20-60° C. In some embodiments, the gas environment in which the alkaline reagent being added to the mixed solution is an inert atmosphere, so as to prevent the introduction of oxidizing gas and interfere with the progress of the reaction.

In the embodiment of the present application, the method for adding alkaline reagent to the mixed solution is as follows: in an inert atmosphere, under stirring conditions, adding alkaline reagent to the mixed solution to promote the reaction, and the stirring time is 10-120 min.

The precipitant was added to the mixed system, and the metal oxide nanoparticles in the reaction system were precipitated and collected by centrifugation. In some embodiments, the precipitant is at least one selected from the group consisting of ethyl acetate, methyl acetate, propyl acetate, butyl acetate, ethyl formate, methyl formate, propyl formate, butyl formate, but not limited thereto. In some embodiments, in the step of adding precipitant to the mixed system, the volume ratio of precipitant to the mixed system was (1~5):1, and the precipitant was added to the mixed system to promote the precipitation of metal oxide nanoparticles. In some embodiments, the metal oxide nanoparticles are separated by high-speed centrifugation.

The separated metal oxide nanoparticles after passivation treatment are dispersed in corresponding reagents again to prepare aqueous metal oxide nanoparticles with better solubility and stability.

A second aspect of the embodiments of the present application provides a quantum dot prepared by the above-mentioned method for preparing metal oxide nanoparticles.

The quantum dots provided in the examples of this application are prepared by the above method. Therefore, the metal atoms on the surface of metal oxide nanoparticles are combined with X—($SO_2$)—$O^-$, and the oxygen anions in X—($SO_2$)—$O^-$ can quickly interact with metal atoms on the surface of metal oxide nanoparticles and fill oxygen vacancies on the surface, thereby achieving passivation of metal oxide nanoparticles, reducing the surface defect state of metal oxide nanoparticles, and improving the stability of metal oxide nanoparticles.

A third aspect of the embodiments of the present application provides a quantum dot light-emitting diode, which includes a quantum dot light-emitting layer, and the material of the quantum dot light-emitting layer is the above metal oxide nanoparticles.

In the quantum dot light-emitting diode provided in the embodiments of the present application, since the material of the quantum dot light-emitting layer is the above-mentioned metal oxide nanoparticles, the quantum dot light-emitting layer has excellent stability.

The following description will be given in combination with specific embodiments.

Example 1

A method for preparing metal oxide nanoparticles, including the following steps:

10 mmol of organic reagent of OH—$(CH_2)_2$—($SO_2$)—$(CH_2)_3$—$NH_2$ was dispersed into 5 ml of ethanol reagent to fully dissolve, then the organic reagent solution was added into 3 ml of ethanol solution containing 100 mg of aqueous ZnO nanoparticles and was mixed and stirred for 10 min to make the mixture form a homogeneous solution.

12 mmol of ammonia water reagent was added to the above-mentioned homogeneous solution at one time and stirred to make them evenly mixed. The solution was then further stirred at 40° C. for 30 min in an argon atmosphere, so that the water-phase ZnO nanoparticles are fully passivated in the non-polar reagent to obtain surface passivated ZnO nanoparticles.

15 ml of ethyl acetate solution was added to the above reaction system, and then centrifuged to separate to prepare passivated aqueous ZnO nanoparticles.

Example 2

A method for preparing metal oxide nanoparticles, including the following Steps:

10 mmol of organic reagent of OH—$(CH_2)_3$—($SO_2$)—$(CH_2)_4$—COOH was dispersed into 5 ml of methanol reagent to fully dissolve, then the organic reagent solution was added into 3 ml of methanol solution containing 100 mg of aqueous NiO nanoparticles, and was mixed and stirred for 10 min to make the mixture form a homogeneous solution.

12 mmol of tetramethylammonium hydroxide was added into the above homogeneous solution at one time and was stirred well to make them evenly mixed. The solution was then further stirred at 50° C. for 30 min in an argon atmosphere, so that the aqueous NiO nanoparticles are fully passivated in the non-polar reagent, and the surface is obtained, passivated NiO nanoparticles.

15 ml of methyl acetate solution was added to the above reaction system, and then was centrifuged to separate to prepare passivated aqueous NiO nanoparticles.

Comparative Example 1

A method for preparing metal oxide nanoparticles, including the following steps:

100 mg of ZnO nanoparticles in aqueous phase was dispersed into 3 ml of ethanol solution, and was mixed and stirred for 10 min to form a homogeneous solution.

Argon was introduced into the above mixture at a rate of 1 ml/min at room temperature, and the ventilation was continued for 1 h with stirring.

15 ml of ethyl acetate solution was added to the above reaction system, and then was centrifuged to separate to prepare passivated aqueous ZnO nanoparticles.

Comparative Example 2

A method for preparing metal oxide nanoparticles, including the following steps:

100 mg of aqueous NiO nanoparticles was dispersed into 3 ml of ethanol solution, and was mixed and stiffed for 10 min to form a homogeneous solution.

Argon was introduced into the above mixture at a rate of 1 ml/min at room temperature, and the ventilation was continued for 1 h with stirring.

15 ml of ethyl acetate solution was added to the above reaction system, and then was centrifuged to separate to prepare passivated aqueous NiO nanoparticles.

The metal oxide nanoparticles prepared in Examples and Comparative Examples were tested for mobility and fluorescence peak position changes with time, and the test results are shown in Table 1 below.

TABLE 1

| | Mobility vs Time | Fluorescence peak position vs Time |
|---|---|---|
| Comparative Example1 | Gradually decrease over time | Defect peak will appear over time |
| Comparative Example2 | Gradually decrease over time | Defect peak will appear over time |
| Example 1 | Basically unchanged over time | Defect peak will not appear over time |
| Example 2 | Basically unchanged over time | Defect peak will not appear over time |

It can be seen from Table 1 that, compared with the comparative examples, the metal oxide nanoparticles prepared in the examples of the present application have enhanced stability.

The above are only optional embodiments of the present application, and are not intended to limit the present application. Various modifications and variations of this application are possible for those skilled in the art. Any modification, equivalent replacement, improvement, etc. made within the spirit and principle of this application shall be within the scope of the claims of the present application.

What is claimed is:

1. A method for preparing metal oxide nanoparticles, comprising the following steps:
   providing an organic reagent having a molecular formula of X—(SO$_2$)—Y and a metal oxide nanoparticle sample, wherein the metal oxide nanoparticle sample is an aqueous metal oxide nanoparticle; in X—(SO$_2$)—Y, X contains a polar functional group, and Y represents a substituent containing between 1 and 8 carbon atoms; and
   mixing the organic reagent and the metal oxide nanoparticle sample in a liquid medium to obtain a resulting mixed solution and adding an alkaline reagent to the resulting mixed solution to prepare the metal oxide nanoparticles.

2. The method for preparing metal oxide nanoparticles according to claim 1, wherein the polar functional group is at least one selected from the group consisting of hydroxyl, carboxyl and amino.

3. The method for preparing metal oxide nanoparticles according to claim 1, wherein in the organic reagent with the molecular formula of X—(SO$_2$)—Y, X is one selected from the group consisting of —(CH$_2$)$_n$—NH$_2$; (CH$_2$)$_n$—OH and —(CH$_2$)$_n$—COOH, wherein n is an integer ranging between 1 and 18.

4. The method for preparing metal oxide nanoparticles according to claim 1, wherein the organic reagent having the molecular formula of X—(SO$_2$)—Y is at least one selected from the group consisting of OH—(CH$_2$)$_n$—(SO$_2$)—(CH$_2$)$_m$—NH$_2$, OH—(CH$_2$)$_n$—(SO$_2$)—(CH$_2$)$_m$—COOH, OH—(CH$_2$)$_n$—(SO$_2$)—(CH$_2$)$_m$—OH, NH$_2$—(CH$_2$)$_n$—(SO$_2$)—(CH$_2$)$_m$—NH$_2$ and COOH—(CH$_2$)$_n$—(SO$_2$)—(CH$_2$)$_m$—COOH, wherein m is an integer ranging between 1 and 18, and n is an integer ranging between 1 and 18.

5. The method for preparing metal oxide nanoparticles according claim 1, wherein the liquid medium is at least one selected from the group consisting of ethanol, methanol, isopropanol, acetonitrile, and tetrahydrofuran.

6. The method for preparing metal oxide nanoparticles according to claim 1, wherein the step of mixing the organic reagent and the metal oxide nanoparticle sample in a liquid medium comprises: dissolving the organic reagent in the liquid medium to form an organic solution;
   mixing the organic solution with the metal oxide nanoparticle sample.

7. The method for preparing metal oxide nanoparticles as claimed in claim 6, wherein in the organic solution, a concentration of the organic reagent is 0.1-10 mmol/L.

8. The method for preparing metal oxide nanoparticles according to claim 1, wherein in the step of mixing the organic reagent and the metal oxide nanoparticle sample in a liquid medium, a molar/mass ratio of the organic reagent to the metal oxide nanoparticles is (1-50 mmol): 100 mg.

9. The method for preparing metal oxide nanoparticles according to claim 1, wherein the alkaline reagent is at least one selected from the group consisting of tetramethylammonium hydroxide and ammonia water.

10. The method for preparing metal oxide nanoparticles according claim 1, after the step of mixing the organic reagent and the metal oxide nanoparticle sample in a liquid medium to obtain a resulting mixed solution and adding an alkaline reagent to the resulting mixed solution to prepare the metal oxide nanoparticles, further comprising: adding a precipitant to a resulting mixed system.

11. The method for preparing metal oxide nanoparticles according to claim 10, wherein in the step of adding the precipitant to the resulting mixed system, the precipitant is added to the resulting mixed system according to a volume ratio of the precipitant to the mixing system of (1-5): 1.

12. The method for preparing metal oxide nanoparticles according to claim 1, wherein in the step of mixing the organic reagent and the metal oxide nanoparticle sample in a liquid medium and adding alkaline reagent, a method for adding the alkaline reagent is as follows: in an inert atmosphere, adding the alkaline reagent to the mixed solution under a stirring condition.

13. The method for preparing metal oxide nanoparticles according to claim 12, wherein in the step of adding alkaline reagent to the resulting mixed solution, the alkaline reagent is added to the mixed solution according to a molar dosage ratio of the alkaline reagent to the organic reagent of (1-3): 1.

14. The method for preparing metal oxide nanoparticles according to claim 13, wherein the stirring condition comprises a stirring time of 10-120 min.

15. Metal oxide nanoparticles, wherein the metal oxide nanoparticles are prepared by the following steps:

provided an organic reagent having a molecular formula of X—(SO$_2$)—Y and a metal oxide nanoparticle sample, wherein the metal oxide nanoparticle sample is an aqueous metal oxide nanoparticle; in X—(SO$_2$)—Y, X contains a polar functional group, and Y represents a substituent containing between 1 and 8 carbon atoms; and mixing the organic reagent and the metal oxide nanoparticle sample in a liquid medium to obtain a resulting mixed solution and adding an alkaline reagent to the resulting mixed solution to prepare the metal oxide nanoparticles, wherein the metal oxide nanoparticles contain X—(SO$_2$)—O$^-$ binding to metal atoms on surfaces of the metal oxide nanoparticles, in which, X is one selected from the group consisting of —(CH$_2$)$_n$—NH$_2$, —(CH$_2$)$_n$—OH and —(CH$_2$)$_n$—COOH, wherein n is an integer ranging, between 1 and 18.

16. A quantum dot light-emitting diode, comprising a quantum dot light-emitting layer, wherein a material of the quantum dot light-emitting layer is metal oxide nanoparticles prepared by a method, comprising the following steps:

providing an organic reagent having a molecular formula of X—(SO$_2$)—Y and a metal oxide nanoparticle sample, wherein the metal oxide nanoparticle sample is an aqueous metal oxide nanoparticle; in X—(SO$_2$)—Y, X contains a polar functional group, and Y represents a substituent containing between 1 and 8 carbon atoms; and mixing the organic reagent and the metal oxide nanoparticle sample in a liquid medium to obtain a resulting mixed solution and adding an alkaline reagent to the resulting mixed solution to prepare the metal oxide nanoparticles, wherein the metal oxide nanoparticles contain X—(SO$_2$)—O$^-$ binding to metal atoms on surfaces of the metal oxide nanoparticles, in which, X is one selected from the group consisting of —(CH$_2$)$_n$—NH$_2$, —(CH$_2$)$_n$—OH and —(CH$_2$)$_n$—COOH, wherein n is an integer ranging between 1 and 18.

\* \* \* \* \*